United States Patent [19]

Branom

[11] Patent Number: 4,709,307
[45] Date of Patent: Nov. 24, 1987

[54] CLOTHING WITH ILLUMINATED DISPLAY

[75] Inventor: David E. Branom, St. Louis County, Mo.

[73] Assignee: McKnight Road Enterprises, Inc., Maryland Heights, Mo.

[21] Appl. No.: 876,685

[22] Filed: Jun. 20, 1986

[51] Int. Cl.$^4$ ............................................. F21L 15/08
[52] U.S. Cl. .................................... 362/103; 362/108; 362/800; 362/806; 40/550; 40/583; 40/586
[58] Field of Search ............... 362/103, 108, 184, 252, 362/800, 806, 808, 812; 40/550, 583, 586; 2/102, 108

[56] References Cited

U.S. PATENT DOCUMENTS

| | | | |
|---|---|---|---|
| 2,120,259 | 6/1938 | Perry | 40/550 |
| 2,557,383 | 6/1951 | Kerwer | 362/812 X |
| 3,549,878 | 12/1970 | Bailey | 362/103 X |
| 3,561,394 | 2/1971 | Pickens | 2/102 X |
| 3,638,011 | 1/1972 | Bain et al. | 362/103 |
| 4,164,008 | 8/1979 | Miller et al. | 362/103 |
| 4,328,533 | 5/1982 | Paredes | 362/108 |
| 4,570,206 | 2/1986 | Deutsch | 362/103 |
| 4,602,191 | 7/1986 | Davila | 315/76 |

Primary Examiner—James C. Yeung
Assistant Examiner—Allen J. Flanigan
Attorney, Agent, or Firm—Polster, Polster & Lucchesi

[57] ABSTRACT

An article of clothing includes a shell forming an outer layer of the article, a liner disposed generally inside the shell and forming an inner layer of the article, and a set of light-emitting diodes or the like forming a predetermined pattern on the exterior of the article of clothing. The set of light-emitting diodes is mounted on a substrate. A power source is provided for illuminating the diodes, as is a control circuit for controlling the energization of the diodes. There is a pocket in the article of clothing in which the power source is removably disposed. A cable electrically connects the diodes and the power source, which cable is disposed generally between the shell and the liner so as to be hidden from view and protected. An overlay has imprinted thereon a pattern corresponding to the predetermined pattern of the diodes. The overlay has openings therethrough through which the diodes extend, and the overlay is secured to the shell.

11 Claims, 11 Drawing Figures

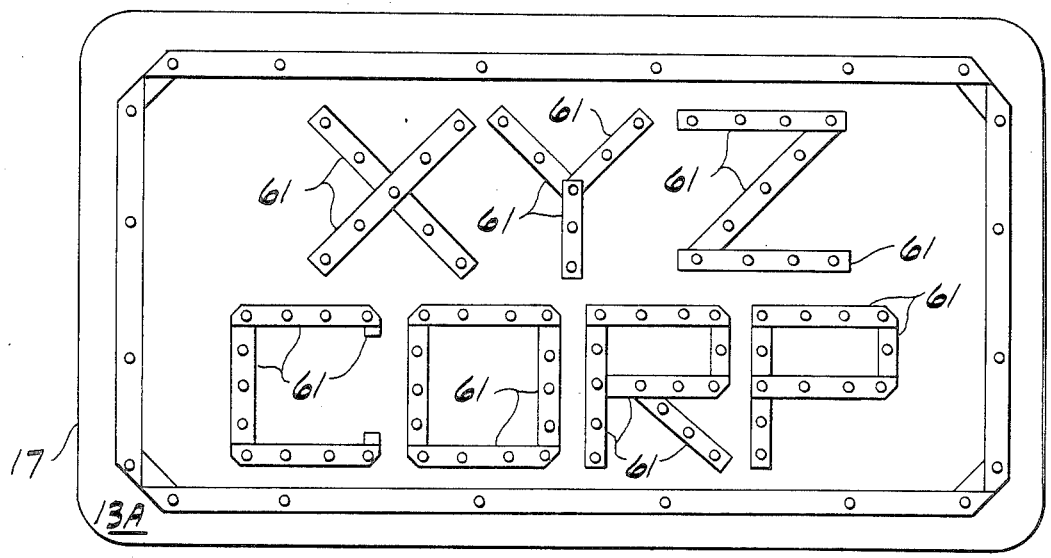
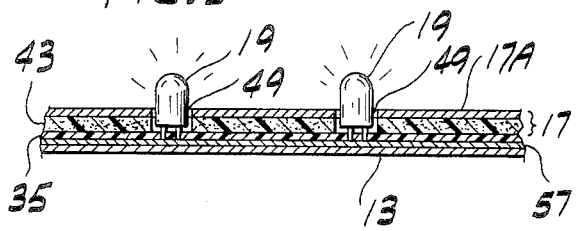
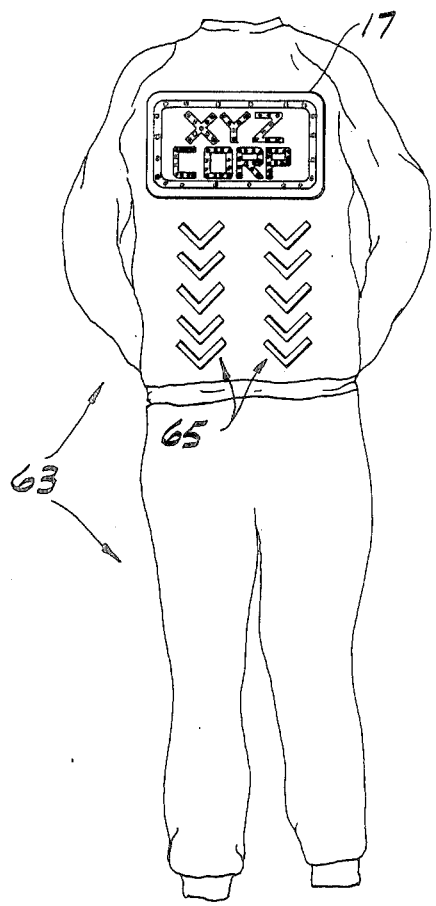

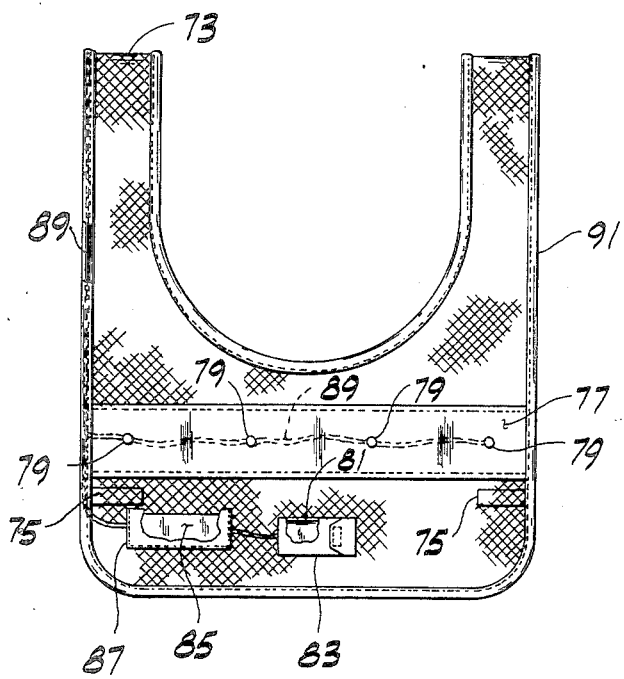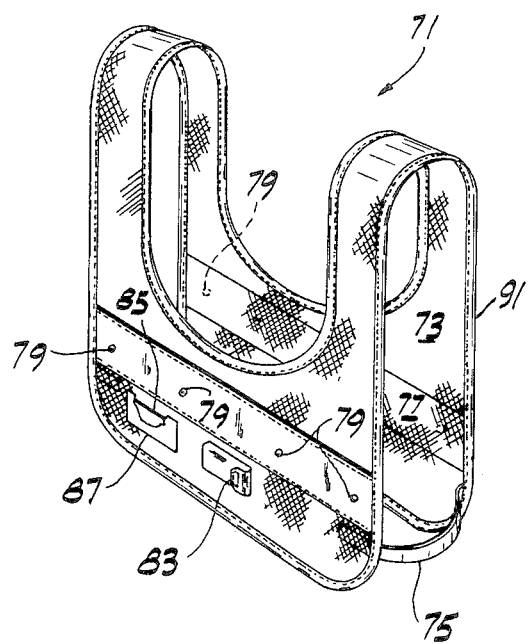

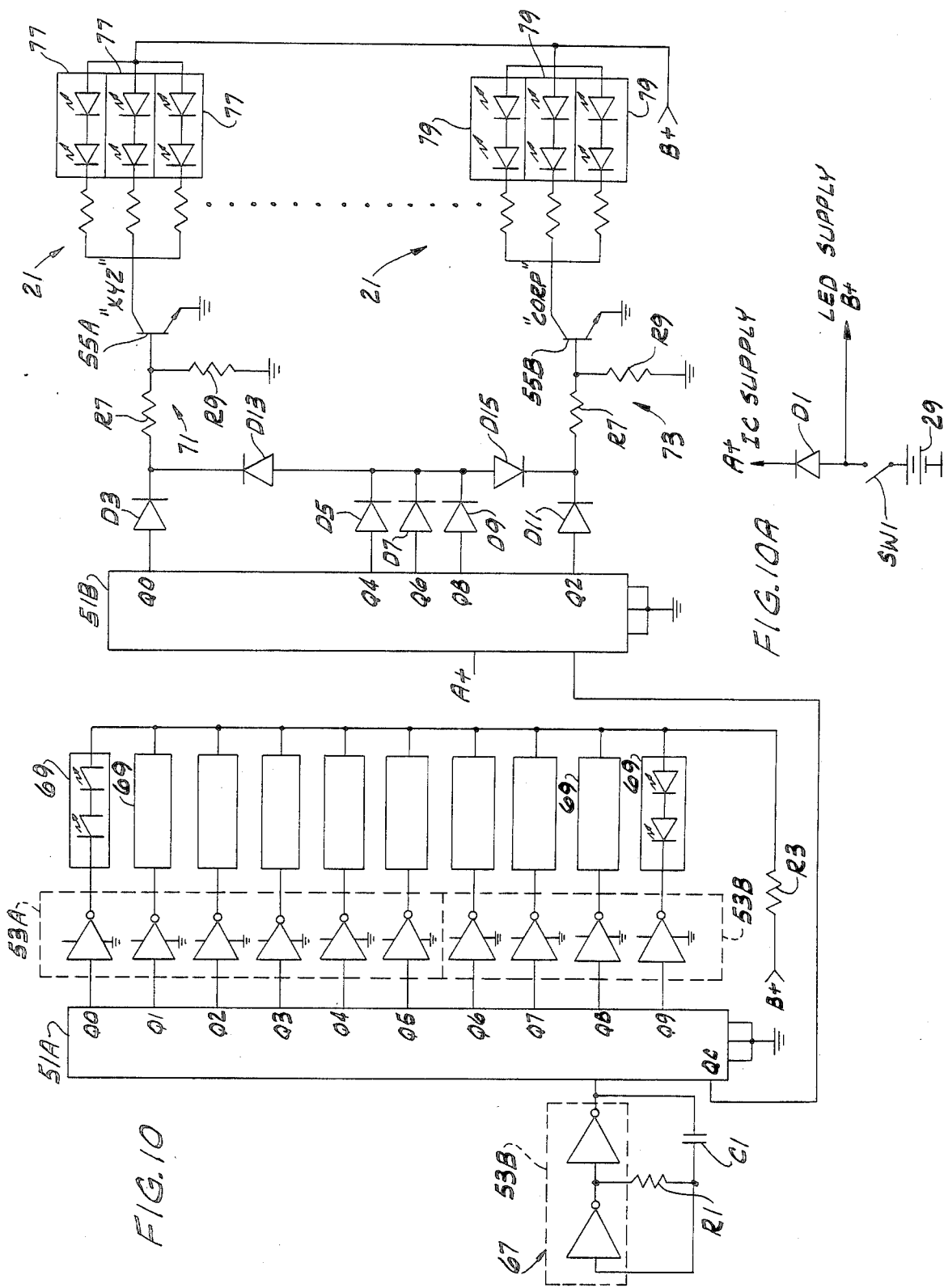

CLOTHING WITH ILLUMINATED DISPLAY

Background of the Invention

This invention relates to wearing apparel and, more particularly, to an illuminated article of clothing.

It has been proposed to use light-emitting diodes (LEDs) on various items of wearing apparel to achieve an ornamental effect. For example U.S. Pat. No. 3,737,647 to Gomi discloses LEDs mounted on dresses and ornamental structures incorporating LEDs. Similarly, U.S. Pat. No. 4,164,008 to Miller et al describes an illuminated article of clothing such as a T-shirt having a thin, supple, printed circuit sheet fastened to one side of a garment. The Miller et al printed circuit supports light-emitting diodes which protrude through the garment. The LEDs are in the form of a predetermined, desired pattern. The T-shirt also has a design formed on the front thereof and the light-emitting diodes form an integrated part of the design. A pre-established pocket is shown in the Miller et al patent into which control circuitry and a battery are located. It is stated in Miller et al that the battery, etc. could be clipped or hooked onto the garment without the need of any pocket at all. Electric leads extend from the control circuitry in the pocket to the printed circuit board in Miller et al. The pocket is stated to be formed either on the inside or the outside of the T-shirt, and either on the front or the back of the T-shirt.

U.S. Pat. No. 4,231,079 to Heminover discloses an article of wearing apparel such as a rigid, opaque hat or a multi-layer belt which has light-emitting diodes mounted thereon for viewing. The circuitry in Heminover is concealed within the article of apparel or on the person of the wearer. A rechargeable battery is secured to the inside of the hat. On the belt shown in Heminover, the terminals for the light-emitting diodes are located between the outer layer and the inner layer of the belt so that they do not inconvenience the user. The control circuitry for the belt in Heminover depends from the belt so that it can be disposed out of view, such as in a left trouser pocket. U.S. Pat. No. 4,308,572 to Davidson et al describes an article of clothing having a plurality of holes arranged therein in a predetermined pattern, and a plurality of light-emitting diodes mounted on a flexible substrate, which extend through the holes so as to appear to be mounted on the surface of the fabric. The lights or light-emitting diodes are energized in a preferred sequence so as to depict motion. In one embodiment of the Davidson et al invention, the power source is a battery which may either be mounted directly on the circuit board or located in a remote position and connected to the circuit board by electrical wires. An image can be imprinted on the fabric material in the Davidson et al patent, which image corresponds generally to the pattern of the light-emitting diodes protruding through the fabric. The circuit board in Davidson et al is located in a pocket 10, one surface of which is the outer layer of the garment. In FIG. 6 of Davidson et al, the battery is located in a remote portion of the garment and is connected to the flexible circuit board by means of a pair of electrical conductors. This battery is apparently disposed in a second pocket which is unnumbered.

The inventions described above could be improved. For example, these inventions seem to require that the battery either be mounted on the circuit board containing the LEDs or be connected to that circuit board by a set of exposed wires. The first alternative results in a heavier than desired circuit board on the article of clothing, while the second can potentially result in the wires connecting the battery and the circuit board being disconnected from the circuit boards by the wearer. Furthermore, if the battery is positioned on the circuit board, it could be relatively inaccessible when it is desired to change the battery. In addition, the back of a printed circuit board is quite often fairly sharp as a result of the leads of the components extending through the circuit board. The inventions discussed above do not adequately protect the article of clothing or the wearer from scratches caused by these sharp points. Furthermore, although the inventions discussed above resulted in increased visibility of the ornamentation of an article of clothing, it is believed that such visibility can be further improved.

SUMMARY OF THE INVENTION

Among the several objects and features of the present invention is the provision of an illuminated article of clothing of improved construction.

Another object of the present invention is an article of clothing with improved reliability of the light-emitting components.

An additional object of the present invention is to provide an article of clothing with a greater attention-getting capability.

A further object of the present invention is to provide for easy accessibility of the power source of an illuminated article of clothing.

Another object of the present invention is to minimize or eliminate the possibility of the circuit board leads scratching either the garment or the wearer.

Other objects and features will be in part apparent and in part pointed out hereinafter.

Briefly, an article of clothing of the present invention includes a shell forming an outer layer of the article of clothing. A liner is disposed generally inside the shell and forms an inner layer of the article. A set of light-emitting diodes or the like form a predetermined pattern on the exterior of the article of clothing, the set of diodes being mounted on a substrate. A power source is provided for illuminating the diodes and control circuit means control the energization of the diodes. The power source is removably disposed in a pocket in the article of clothing. A cable electrically connects the diodes in the power source, which cable is disposed generally between the shell and the liner so as to be hidden from view. An overlay has imprinted thereon a pattern corresponding to the predetermined pattern of the diodes. The overlay has openings therethrough through which the diodes extend, the overlay being secured to the exterior of the shell.

In a second embodiment of the present invention the article of clothing of the present invention is particularly suited for exercising. It includes a shell forming the body of the article of clothing, at least one strip of reflective tape secured to the shell to form a predetermined pattern, and a set of light-emitting diodes or the like disposed along the strip of reflective tape to accentuate the predetermined pattern on the exterior of the article of clothing. It also includes a power source for illuminating the diodes, control circuit means for controlling the energization of the diodes, and a pocket in the article of clothing in which the power source is removably disposed. A cable electrically connects the diodes and the power source. The cable is disposed generally between the shell and the reflective tape so as to be hidden from view.

BRIEF DESCRIPTION OF THE DRAWINGS

FIG. 5 is a cross sectional view, taken along line 5—5 of FIG. 3; and

FIG. 6 is a rear view, on an enlarged scale, of a portion of a second embodiment of the present invention;

FIG. 7 is a rear view of a third embodiment of the present invention;

FIG. 8 is a front view of a fourth embodiment of the present invention;

FIG. 9 is a perspective view of the embodiment of FIG. 8;

FIG. 10 is an electrical schematic of the circuitry of the article of clothing of FIG. 1; and FIG. 10A is an electrical schematic of the power supply for the circuitry of FIG. 10.

Similar reference characters indicate similar parts throughout the several views of the drawings.

DESCRIPTION OF THE PREFERRED EMBODIMENT

Figure 1:
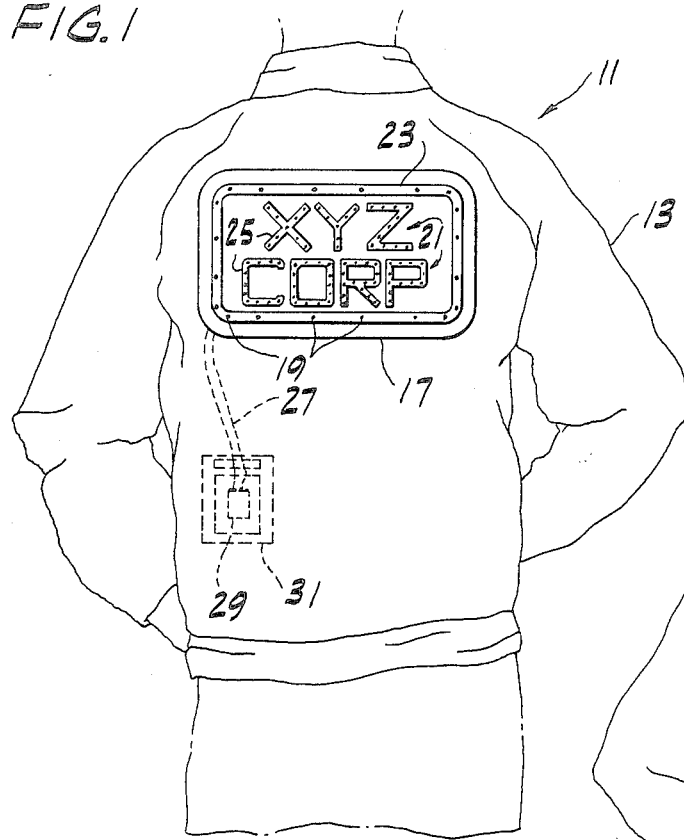
FIG. 1 is a rear view of an article of clothing of the present invention.

An article of clothing 11 (FIG. 1) of the present invention is shown as a jacket, although it should be understood that any other article of clothing, such as the top of an exercise or jogging outfit or an exercise vest, could also be made in accordance with the present invention as well. Jacket 11 includes a shell 13 which forms the exterior surface of the jacket. A liner 15 (FIG. 2) is disposed generally inside the shell and forms an inner layer of the jacket. An overlay or patch 17 is disposed on the back of jacket 11 and is suitably secured thereto by adhesive or sewing or the like. The overlay has a number of openings therein through which a number of light-emitting diodes extend. These diodes are arranged in a first set 19 which forms a border for overlay 17, and a second set 21 which forms a plurality of letters. Overlay 17 has imprinted thereon in a contrasting color or the like a background pattern 23 of generally the same shape as the pattern formed by border diodes 19, and a background pattern 25 of generally the same shape as the letter-forming diodes 21. These patterns surround their corresponding diodes and form a background therefor. The pattern formed by letter diodes 21 can be suitably selected to spell the name of a company for advertising purposes or can make up any other desirable pattern. Diode sets 19 and 21 are disposed on a printed circuit board (FIG. 4), and receive power for illumination of the diodes via a cable or lead 27 connected to a power source or battery 29 disposed in an interior pocket 31 of the jacket. Although cable or lead 27 is described as a cable, it should be appreciated that a pair of twisted, insulated wires may readily be used and, for this application, are considered to be a cable. Battery 29 can be any suitable power source, such as a standard 9-volt battery. Overlay 17 is somewhat larger than the printed circuit board so that the securing of the overlay to jacket 11 results in the circuit board being secured in place between the overlay and the jacket. Of course, if desired, the circuit board could be independently secured to jacket 11.

Figure 2:
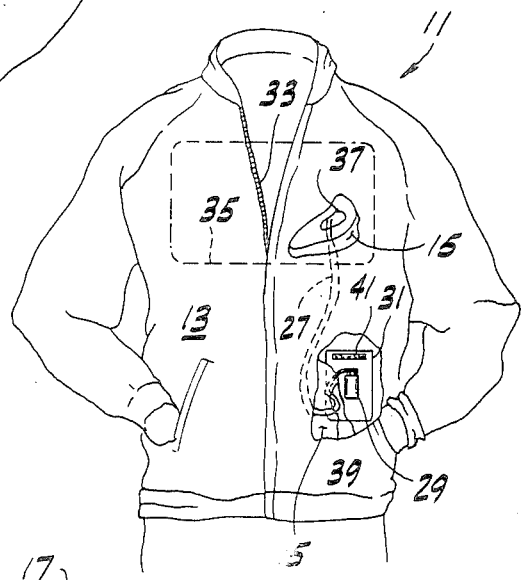
FIG. 2 is a front view with parts broken away for clarity of the article of clothing of FIG. 1.

Turning now to FIG. 2, jacket 11 is fastened in the front by means of slide fastener 33 or other suitable closure. Circuit board 35 is shown in phantom in FIG. 2. Cable 27 is electrically connected to circuit board 35 and passes through a slit 37 in shell 13 of the jacket. From the point of the slit, cable 27 is disposed between shell 13 and liner 15. It extends from slit 37 to a second slit 39 in pocket 31. In pocket 31, the other end of cable 27 is suitably connected to 9-volt battery 29. With this arrangement, wires or cable 27 are completely hidden from view and thereby prevented from being entangled by the user or disconnected from either the circuit board or the battery. Pocket 31 is preferably on the inner front surface of jacket 11 for easy access. It consists of a layer of material attached to liner 15. The upper end of pocket 31 is of suitable size to receive battery 29 for easy replacement of the battery, if necessary. To prevent the battery from inadvertently slipping out of pocket 31, a hook and pile fastener 41 is disposed at the mouth of the pocket. This construction allows the pocket to be reliably closed, yet it remains easy to open when it is necessary to change the battery. Although pocket 31 could easily be designed to accommodate logic circuitry for controlling the energization of diodes 19 and 21, it is preferred that this circuitry be disposed on printed circuit board 35 (which forms the substrate for the diodes) rather than in the pocket so that a relatively simple cable 27 can be used to connect circuit board 35 and battery 29.

Figure 3:
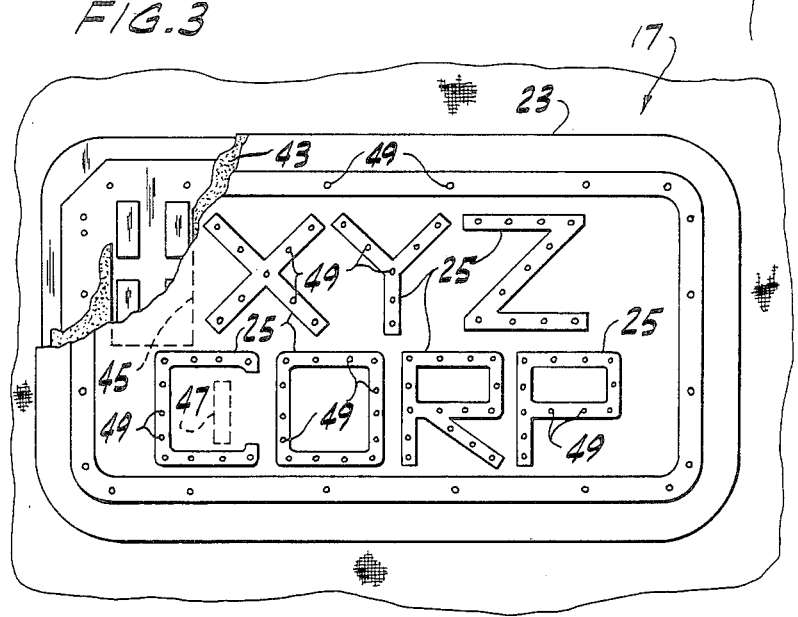
FIG. 3 is a front view of an overlay portion of the article of clothing of FIG. 1, with parts cut away for clarity.

Overlay 17 (FIG. 3) has secured by a suitable adhesive to the back surface thereof a sponge-like layer 43 of plastic material which is roughly one-sixteenth of an inch thick and extends generally over the entire rear surface of overlay 17. When assembled, layer 43 abuts the top surface of printed circuit board 35. As is discussed below, circuit board 35 includes a number of integrated circuits and the other semi-conductor devices. For purposes of heat dissipation, there are provided generally rectangular openings 45 and 47 in the layer 43 so as to not overheat the semi-conductor devices. The openings in overlay 17 through which the diodes extend (labelled 49 in FIG. 3) extend not only through the front surface 17A of overlay 17 but also through the sponge-like layer 43. The front surface of the overlay is preferably a fabric material upon which can be imprinted the backgrounds 23 and 25 by suitable process such as silk-screening. The back of this fabric layer 17A is preferably plasticized so that openings 49 may be punched through overlay 17. The plasticized layer prevents the fabric from unraveling at the point of the openings 49.

Figure 4:
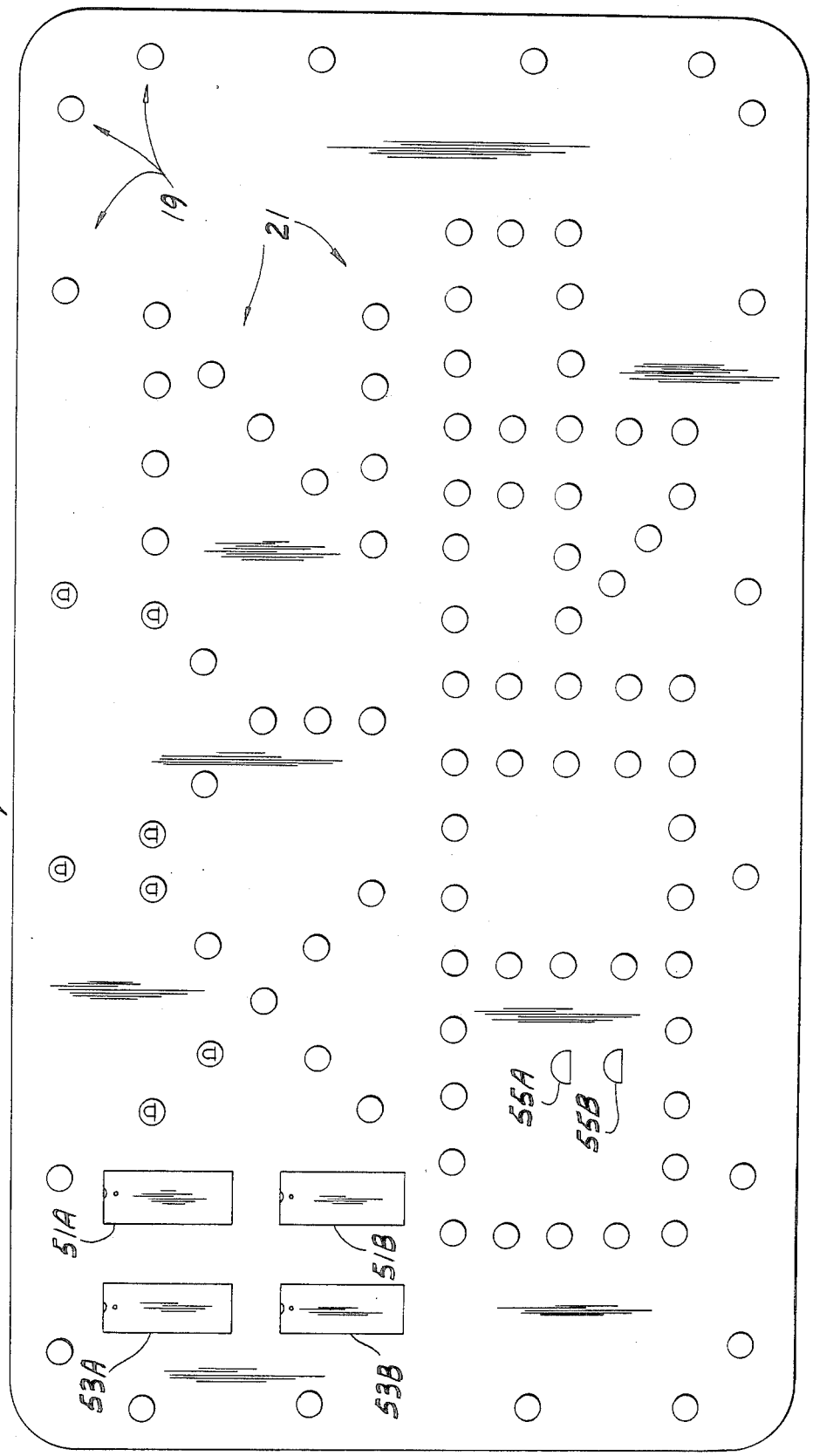
FIG. 4 is a simplified elevation of the printed circuit board used in the display portion of the article of clothing of FIG. 1.

Printed circuit board 35 is shown in simplified form in FIG. 4. For purposes of clarity, the conductors between the elements disposed on the printed circuit board and the resistors described below are omitted. Set 19 of light-emitting diodes are secured to and disposed around the periphery of printed circuit board 35. The set of diodes 21, making up the words "XYZ" and "CORP", are secured to and disposed in the interior area of the printed circuit board. The circuitry for controlling the energization of diodes 19 and 21 is preferably disposed upon printed circuit board 35 as well. As shown, these include a pair of decade counters 51A and 51B, and a pair of hex inverting buffers 53A and 53B. In addition, a pair of NPN transistors 55A and 55B are disposed on the printed circuit board as well. Opening 45 in layer 43 (FIG. 3) is disposed so as to receive decade counters 51A and 51B and hex inverting buffers 53A and 53B, while opening 47 is disposed so as to receive transistors 55A an 55B.

Turning now to FIG. 5, diodes 19 are shown to extend through openings 49 in fabric layer 17A of overlay 17. At their bases, diodes 19 (or equivalently diodes 21) are suitably connected by solder or the like to printed circuit board 35. Note that the leads of diodes 19 extend irregularly down below the bottom surface of printed circuit board 35. To protect the shell 13 of jacket 11 from being scratched or damaged by these protrusions, a layer 57 of fish paper is suitably disposed between the back of printed circuit board 35 and shell 13. This fish paper also serves as an insulator between the jacket shell and the back of the circuit board.

Turning now to FIG. 6, an alternative embodiment of the article of clothing of the present invention is shown. More particularly, this embodiment of the invention is particularly useful for exercise outfits. In this embodiment, overlay 17 is suitably secured to the shell 13A of an exercise outfit. The background 25 for the diodes 21 which form a set of words are formed by reflective tape 61 instead of being imprinted on the overlay. Of course any other predetermined pattern such as a straight line could also be formed by the reflective tape.

Yet another embodiment of the present invention is shown in FIG. 7. In this embodiment, the article of clothing is an outfit 63 suitable for jogging or running and the back of the top portion of this outfit includes not only overlay 17 with its accompanying diode displays, but also additional reflective tape 65 arranged in a predetermined pattern, such as the chevrons shown. Of course, the reflective tape could appear in various other places on the exercise outfit 63.

Yet another embodiment of the present invention is shown in FIGS. 8 and 9. In this embodiment the article of clothing is an exercise vest 71. Vest 71 includes a foraminiferous shell 73 which forms the body (back and front) of the vest. The sides of vest 71 are open and the front and back are suitably secured together during use by a pair of hook and pile fastener tabs 75. Vest 71 further includes two strips 77 of reflective tape disposed in a predetermined pattern on the front and back of the vest. The reflective tape is suitably secured to the shell by sewing, adhesive, or the like. A set of LEDs 79 are disposed along each strip of reflective tape to accentuate the predetermined pattern, in this case a straight line. The diodes themselves protrude through the tape and have their electrical connections made in the area between the reflective tape and the shell. A battery 81 disposed in a hook and pile fastener closed pocket 83 is provided for illuminating the diodes 79. The pocket is located at some convenient spot on vest 71 so as to not interfere with the movements of the person wearing the vest. A control circuit 85 is also suitably disposed on vest 71. As shown this control circuit in the present embodiment is hidden in a pocket 87 disposed directly below reflective tape 77. A cable 89 is provided for electrically connecting the diodes and the battery. The cable is generally disposed between the shell and the reflective tape so as to be hidden from view. The shell has a bias tape 91 extending along each margin and forming its border. Cable 89 is hidden in bias tape 91 as it passes from the front reflective tape to the back reflective tape so that the cable is hidden from view here as well. It should be appreciated that the hidden nature of the cable also protects it from damage.

The circuitry suitable for controlling the energization of diodes 19 and 21 of FIGS. 1-7 is shown in FIG. 10. In this circuitry, two of the inverting buffers of chip 53B are configured with a 680 K-ohm resistor R1 and a 0.047 micro-farad capacitor Cl to form an oscillator 67. Oscillator 67 supplies pulses at a predetermined rate, such as 30 times per second, to the clock input of decade counter 51A. Decade counter 51A has 10 outputs $Q_0$ through $Q_9$. Upon a pulse from oscillator 67 to the clock input of decade counter 51A, the next one of these outputs $Q_0$ through $Q_9$ in sequence goes high. As the last output $Q_9$ goes high, a high voltage level is generated at a carry output $Q_C$. Each of the outputs $Q_0$ through $Q_9$ of decade counter 51A is connected through one of the inverting buffers of chips 53A and 53B to a pair of diodes 69. The 10 sets of diodes 69 make up the border LEDs 19. The other side of each of these sets of diodes is connected through a one K-ohm resistor R3 to the power supply for the LEDs. As seen in FIG. 10A, battery 29 is connected through an optional switch SW1 to form the power supply for the LEDs. The switch SW1 is also connected through a diode D1 to form the power supply for the integrated circuits. As each output of decade counter 51A goes high, which happens about three times a second, the output of its corresponding inverting buffer goes low, which causes current to flow from the LED supply through resistor R3 to and through the LED set 69 corresponding to that particular decade counter output. As a result, the LEDs 19, making up the border of overlay 17, each flash on and off at a predetermined rate, such as three times per second. Since each pair 69 of LEDs is connected to a different one of the outputs $Q_0$ through $Q_9$ of decade counter 51A, the diodes are lit at different times which gives a pleasing ornamental effect. In addition, LEDs of a particular set 69 can be spaced at different locations, and preferably opposing locations, along the border to further increase the ornamental effect.

The $Q_C$ or overflow output of decade counter 51A is connected to the clock input of decade counter 51B so that the decade counter 51B is clocked at a predetermined rate, such as three times per second. Decade counter 51B also includes 10 outputs $Q_0$ through $Q_9$, but only outputs $Q_0$, $Q_2$, $Q_4$, $Q_6$, and $Q_8$ are used in the present embodiment of the invention. Signals on outputs $Q_0$, $Q_2$, $Q_4$, $Q_6$, and $Q_8$ are supplied to the rest of the circuitry of FIG. 10 through a set of isolating diodes $D_3$, $D_5$, $D_7$, $D_9$, and $D_{11}$, there being one diode for each of said outputs. The isolated output signals from outputs $Q_4$, $Q_6$, and $Q_8$ of decade counter 51B are tied together and are supplied through a diode $D_{13}$ to a voltage divider 71 connected to the base of transistor 55A. Similarly, the combined output signals of outputs $Q_4$, $Q_6$, and $Q_8$ are supplied through a diode $D_{15}$ to a voltage divider 73 connected to the base of transistor 55B. The isolated output signal from output $Q_0$ is also connected to voltage divider 71, while the isolated output signal from output $Q_2$ is also supplied to voltage divider 73. The voltage dividers are made up of a pair of resistors $R_7$ and $R_9$, resistors $R_7$ being 4.7 K-ohm resistors, and resistors $R_9$ being 470 K-ohm resistors so that the voltage supplied to the base of each transistor 55A and 55B is generally 99 percent of the voltage supplied to the respective voltage dividers. When a high voltage is supplied to the base of one of the transistors 55A or 55B, that transistor conducts. The emitter of each transistor 55A and 55B is connected to ground, while the collector of each is connected to an array of LEDs as shown. More particularly, the diodes 21, which make up the letters XYZ, are arranged in series-connected pairs 77, each in series with one of a set of 1 K-ohm resistors $R_{11}$. Each pair 77 and its associated resistor is connected between the power supply for the LEDs and the collector of transistor 55A. Similarly, the diodes making up the word CORP are arranged in series-connected pairs 79 in series with additional 1 K-ohm resistors $R_{11}$. For purposes of clarity, only a few of the series-connected pairs of diodes and resistors $R_{11}$ are shown.

When transistor 55A conducts all of the pairs of diodes 77 associated therewith are energized which causes the letters XYZ to be illuminated. Likewise, when transistor 55B conducts, the diode pairs 79 are all energized, which causes the letters CORP to light up. Since the base of transistor 55A is connected to the $Q_0$, $Q_4$, $Q_6$, and $Q_8$ outputs of decade counter 51B, the letters XYZ are illuminated whenever those particular outputs go high. Likewise, the letters CORP are illuminated whenever the $Q_2$, $Q_4$, $Q_6$, and $Q_8$ outputs of the decade counter go high. Thus, the observer sees the letters XYZ flash on and then off, followed shortly thereafter by the letters CORP flashing on and off as output $Q_2$ goes high. Then, when output $Q_4$ goes high (two clock pulses from decade counter 51A later), both transistors 55A and 55B conduct, causing the letters XYZ and the letters CORP to be illuminated at the same time. Two clock pulses later, output $Q_6$ goes high, which again causes both transistors to conduct for a time and the associated letters to be energized. Likewise, two clock pulses later output $Q_8$ goes high and the letters are all energized again. Two clock pulses after that, output $Q_0$ goes high again, which causes the letters XYZ only to be energized, and so on until switch SW1 is opened or battery 29 is removed.

Control circuit 85 for the embodiment of FIGS. 8 and 9 may be as complicated as that shown for FIGS. 1–7, or it may be much simpler. If all that is desired is to flash the diodes 79 on and off, control circuit 85 may be a simple timing and switching circuit. Various other control circuits would also be reusable, although the present invention is not so limited.

In view of the above, it will be seen that the objects of this invention are achieved and other advantageous results obtained.

As various changes could be made in the above constructions without departing from the scope of the invention, it is intended that all matter contained in the above description or shown in the accompanying drawings shall be interpreted as illustrative and not in a limiting sense.

What is claimed is:

1. An article of clothing comprising:
 a shell forming an outer layer of the article of clothing;
 a liner disposed generally inside the shell and forming an inner layer of said article;
 a set of light-emitting diodes or the like form a predetermined pattern on the exterior of the article of clothing, said set being mounted on a printed circuit board substrate disposed exteriorly of the shell;
 a power source for illuminating the diodes;
 control circuit means for controlling the energization of the diodes;
 a pocket in the article of clothing in which the power source is removably disposed;
 a cable for electrically connecting the diodes and the power source, said cable being disposed generally between the shell and the liner so as to be hidden from view; and
 an overlay having imprinted thereon a pattern corresponding to the predetermined pattern of the diodes, said overlay having openings therethrough through which the diodes extend, said overlay being secured exteriorly to the shell, said overlay being larger than the printed circuit board substrate so that the overlay may be secured to the shell around the periphery of the overlay.

2. An article of clothing as set forth in claim 1 wherein the pocket includes an upper opening which is accessible from the inside of the article, said upper opening being large enough to permit placement of the power source in the pocket and removal therefrom, further including a hook and pile fastener disposed adjacent the mouth of the pocket to selectively open and close said pocket.

3. An article of clothing as set forth in claim 1 wherein the printed circuit board substrate is held in place by the overlay.

4. An article of clothing as set forth in claim 1 wherein the control circuit means is mounted on the same printed circuit board substrate as the light emitting diodes, and wherein the overlay includes a cushioning layer on the side thereof which faces the printed circuit board substrate.

5. An article of clothing comprising:
 a shell forming an outer layer of the article of clothing;
 a linear disposed generally inside the shell and forming an inner layer of said article;
 a set of light-emitting diodes or the like forming a predetermined pattern on the exterior of the article of clothing, said set being mounted on a printed circuit board substrate;
 a power source for illuminating the diodes;
 control circuit means for controlling the energization of the diodes, said control circuit means being mounted on the printed circuit board substrate;
 a pocket in the article of clothing in which the power source is removably disposed;
 a cable for electrically connecting the diodes and the power source, said cable being disposed generally between the shell and the liner so as to be hidden from view; and
 an overlay having imprinted thereon a pattern corresponding to the predetermined pattern of the diodes; said overlay having openings therethrough through which the diodes extend, said overlay being secured to the shell, said overlay being larger than the printed circuit board board substrate so that the overlay may be secured to the shell around the periphery of the overlay, said overlay including a cushioning layer on the side thereof which faces the printed circuit board, said cushioning layer including cutouts disposed around at least a portion of the control circuit means.

6. An article of clothing comprising:
 a shell forming an outerlayer of the article of clothing;
 a liner disposed generally inside the shell and forming an inner layer of said article;

a set of light-emitting diodes or the like forming a predetermined pattern on the exterior of the article of clothing, said set being mounted on a substrate;

a power source for illuminating the diodes;

control circuit means for controlling the energization of the diodes;

a pocket in the article of clothing in which the power source is removably disposed;

a cable for electrically connected the diodes and the power source, said cable being disposed generally between the shell and the liner so as to be hidden from view; and an overlay having imprinted thereon a pattern corresponding to the predetermined pattern of the diodes, said overlay having openings therethrough through which the diodes extend, said overlay being secured to the shell, both the substrate and the overlay being disposed exteriorly of the shell.

7. An article as set forth in claim 6 wherein the shell includes a slit for passage of the cable therethrough.

8. An article of clothing as set forth in claim 6 wherein the diode predetermined pattern defines a plurality of combinations of letters, and wherein the diodes predetermined pattern further defines a border for said plurality of combinations of letters.

9. An article of clothing as set forth in claim 8 wherein the control circuit means includes means for sequentially illuminating selected ones of the border diodes.

10. An article of exercise clothing comprising:

a shell forming the front and back of the article of clothing, said shell including a bias tape border, said article having relatively open sides;

the front and back fo the article of clothing both having at least one strip of reflective tape secured to the shell to form a predetermined pattern;

the front and back of the article of clothing both having a set of light-emitting diode or the like disposed along the strip of reflective tape to accentuate the predetermined pattern on the exterior of the article of clothing;

a power source for illuminating the diodes;

control circuit means for controlling the energization of the diodes;

a pocket in the article of clothing in which the power source is removably disposed; and a cable for electrically connecting the diodes and the power source, said cable being disposed generally between the shell and the reflective tape so as to be hidden from view, said cable in extending between the front and back sets of diodes being hidden in the border.

11. The article of clothing as set forth in claim 10 wherein the shell is foraminiferous.

* * * * *

UNITED STATES PATENT AND TRADEMARK OFFICE
CERTIFICATE OF CORRECTION

PATENT NO. : 4,709,307
DATED : November 24, 1987
INVENTOR(S) : David E. Branom

It is certified that error appears in the above—identified patent and that said Letters Patent is hereby corrected as shown below:

Claim 5, Column 8, Line 36 is "linear" should be "liner".
Claim 5, Column 8, Line 57 is "circuit board board" should be "circuit board".
Claim 10, Column 10, Line 7 is "fo" should "of".

Signed and Sealed this

Twenty-sixth Day of July, 1988

*Attest:*

DONALD J. QUIGG

*Attesting Officer*    *Commissioner of Patents and Trademarks*